United States Patent [19]

Satake

[11] Patent Number: 4,511,812
[45] Date of Patent: Apr. 16, 1985

[54] PROGRAMMABLE LOGIC ARRAY, INCLUDING AN ARRANGEMENT FOR INVALIDATING FAULTY AND TERM OUTPUTS

[75] Inventor: Shozo Satake, Hadano, Japan

[73] Assignee: Hitachi, Ltd., Tokyo, Japan

[21] Appl. No.: 388,620

[22] Filed: Jun. 15, 1982

[30] Foreign Application Priority Data

Jun. 24, 1981 [JP] Japan .................................. 56-96666

[51] Int. Cl.³ ...................... G06F 11/20; G06F 11/22; G11C 29/00
[52] U.S. Cl. .................................... 307/465; 364/716; 371/10
[58] Field of Search ............... 307/465, 466, 467, 468, 307/469, 442, 443, 445, 242, 557, 558, 559, 562, 563; 364/716; 371/10, 11; 340/825.83; 365/96, 103, 104, 200, 201

[56] References Cited

U.S. PATENT DOCUMENTS

| | | | |
|---|---|---|---|
| 3,654,610 | 4/1972 | Sander et al. | 371/10 X |
| 3,681,757 | 8/1972 | Allen et al. | 371/11 X |
| 4,032,894 | 6/1977 | Williams | 364/716 X |
| 4,051,354 | 9/1977 | Choate | 371/10 |
| 4,380,811 | 4/1983 | Götze et al. | 307/365 X |

OTHER PUBLICATIONS

Chu et al., "Redundant Bit Line Decode Circuit", IBM Tech. Discl. Bull., vol. 18, No. 6, pp. 1777–1778, Nov. 1975.

Primary Examiner—Stanley D. Miller
Assistant Examiner—David R. Bertelson
Attorney, Agent, or Firm—Antonelli, Terry & Wands

[57] ABSTRACT

A programmable logic array comprises an AND array for producing AND term outputs on a plurality of AND term lines, an OR array which receives the AND term output of the AND array as inputs thereto, and an AND term disregarding array connected to the AND term lines to selectively invalidate the AND term outputs. The AND term disregarding array functions to disregard one of the AND terms on which a program defect is present.

5 Claims, 5 Drawing Figures

FIG. 1 PRIOR ART
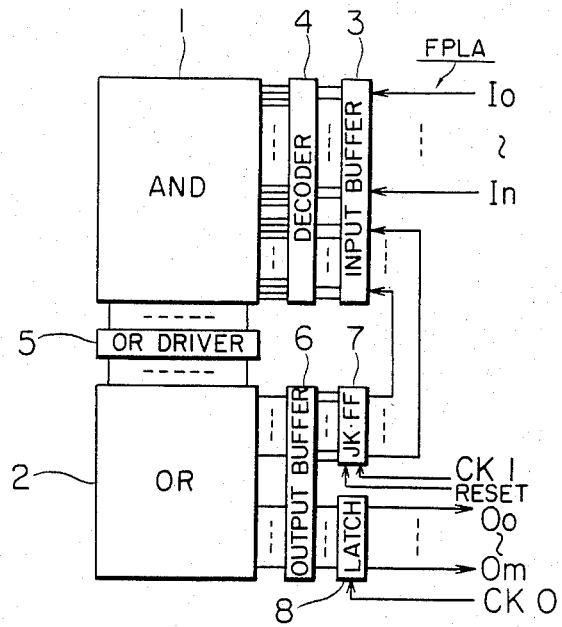
FIG. 2 PRIOR ART
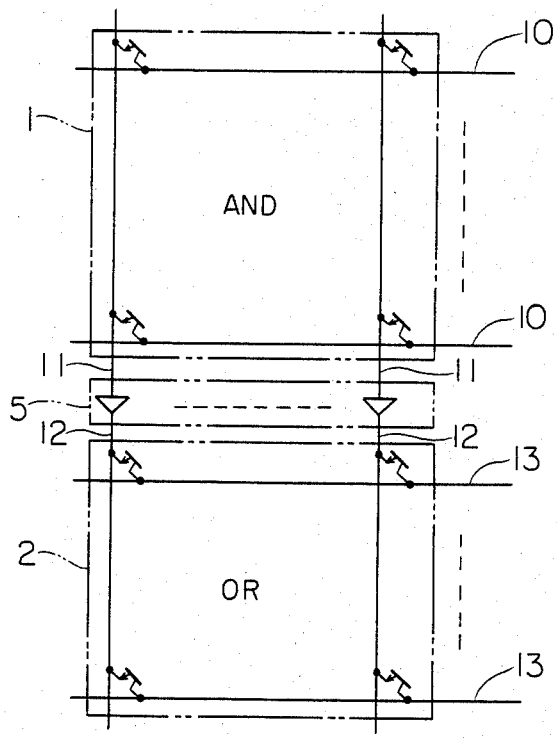
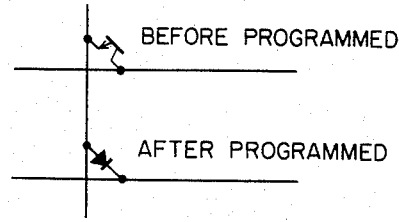
FIG. 3 PRIOR ART

BEFORE PROGRAMMED

AFTER PROGRAMMED

PROGRAMMABLE LOGIC ARRAY, INCLUDING AN ARRANGEMENT FOR INVALIDATING FAULTY AND TERM OUTPUTS

BACKGROUND OF THE INVENTION

1. Field of the Invention

The present invention relates to a programmable logic array and more particularly to a field programmable logic array (FPLA).

2. Description of the Prior Art

An FPLA is a small-quantity large-variety IC (LSI) because it is programmable in the field. A structure of the FPLA is shown in FIG. 1. Inputs I and signals from internal feedback JK-flip-flops 7 (JKFF's) are supplied to an input buffer 3. Outputs from the input buffer 3 are decoded by a 2-bit decoder 4 into each pair of the inputs I and the JKFF's 7. Outputs of the 2-bit decoder 4 are supplied to an AND array 1 as inquiry signals. The AND array 1 can connect any inputs by a field-writable blown-junction type program method. Outputs of the AND array 1 which reflect the inquiry signals are supplied to an OR array 2 through an OR array driver 5. The OR array 2 can also connect any inputs by the blown-junction type program method. Outputs of the OR array 2 are supplied to an OR output buffer 6. Outputs of the OR output buffer 6 are supplied to the internal feedback JKFF's 7 and output latch 8. The inputs to the JKFF's 7 are latched by a clock CK1 and are resettable. The inputs to the output latch 8 are latched by a clock CKO.

FIG. 2 shows details of the AND array 1 and the OR array 2 of the blown-junction type program method. The inquiry signals from the decoder 4 are applied to input lines 10 of the AND array 1, and output signals are produced on output lines 11 in accordance with the inquiry signals. The output lines 11 are connected to input lines 12 of the OR array 2 through the OR array drivers 5 and output signals are produced on output lines 13 of OR array 2 in accordance with the inquiry signals. As shown in FIG. 2, the input lines 10 and the output lines 11 of the AND array 1, and the input lines 12 and the output lines 13 of the OR array 2 are connected by transistors. FIG. 3 shows circuits before and after programming by the blown-junction type programming method. As seen from FIG. 3, the transistor functions as a diode which electrically connects the input line and the output line after it has been programmed. The respective columns (corresponding to the output lines 11) of the AND array 1 are called AND terms and the number of AND terms represents the number of programs of the AND array 1. The output lines 11 of the AND array 1 and the input lines 12 of the OR array 2 are collectively called AND term lines.

The FPLA has an advantage of field programming capability. However, there may be defects which can be detected only after it has been programmed in the field. For example, there may exist a wrong bit which cannot be programmed because of manufacturing defects. If an error is detected by a check after the programming, the FPLA cannot be used and it must be thrown away. Even when all of the terms of the AND array 1 are not used, the FLPA must be thrown away.

SUMMARY OF THE INVENTION

It is an object of the present invention to provide a programmable logic array which allows to disregarding AND terms which include unprogrammable defect bits.

It is a feature of the present invention to provide means for invalidating outputs of the AND terms in order to disregard the unprogrammable defect bits.

BRIEF DESCRIPTION OF THE DRAWINGS

FIG. 1 shows a block diagram of an FLPA.

FIG. 2 shows details of an AND array and an OR array shown in FIG. 1.

FIG. 3 shows circuits before and after being programmed by a blown-junction type programming method.

DESCRIPTION OF THE PREFERRED EMBODIMENT

Figure 4:
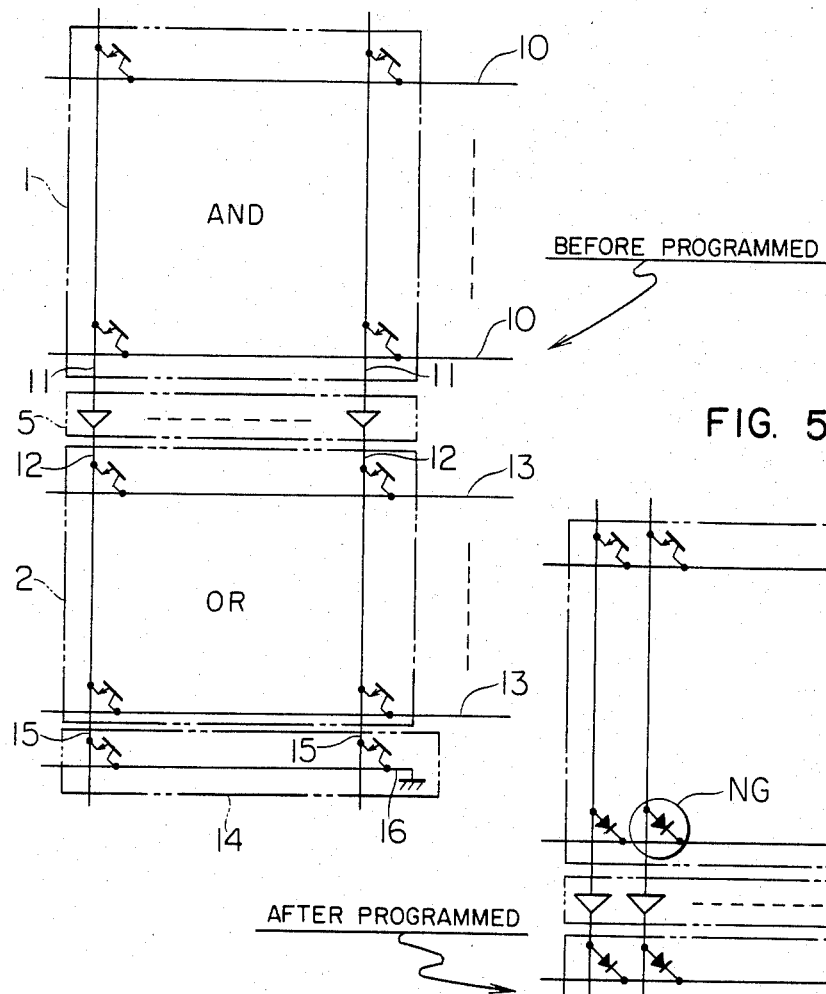
FIG. 4 shows one embodiment of the present invention.

FIG. 4 shows a configuration of an AND array 1 and an OR array 2 of an FLPA in accordance with one embodiment of the present invention. It has an AND term-disregarding array 14. Outputs of the AND array 1 are supplied to the OR array 2 through OR array drivers 5 and to the AND term-disregarding array 14. An output line 16 of the AND term disregarding array 14 is connected to ground (GND) as a constant potential source. The input lines and output lines of each of the AND array 1, the OR array 2 and the AND term-disregarding array 14 are connected by blown-junction type programming transistors.

Figure 5:
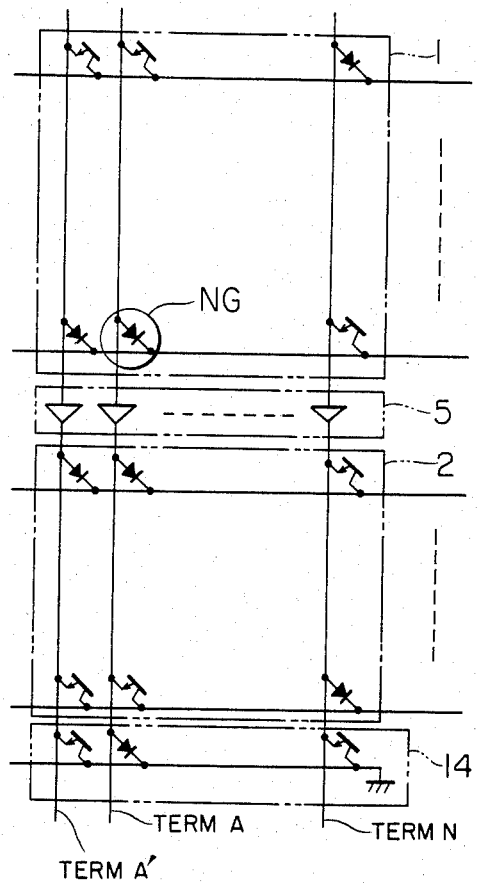
FIG. 5 shows a detailed circuit diagram for explaining the present invention.

FIG. 5 shows the AND array 1 and the OR array 2 after being programmed. For example, if a programming defect (shown by NG) is found at a bit position in the AND array 1 on a term A, a corresponding bit of the AND term-disregarding array 14 on the term A is programmed (that is, the transistor at that bit position form a diode to electrically connect the input line 15 to the output line 16) so that the data of the AND array 1 and the OR array 2 on the term A are supplied to unused term A'. As a result, the term A and the term A' are ANDed and even if the OR array drivers 5 supply high level signals to both the term A and the term A', the term A is forced to a low level because the AND term-disregarding bit on the term A is programmed. Instead, the term A' produces a high level output to drive the OR array 2.

In the present embodiment, while the AND term-disregarding array 14 is connected to the input lines 12 of the OR array 2, the same function can be attained when it is connected to the output lines 11 of the AND array 1. That is, the array 14 is connected to the AND term lines.

As described hereinabove, according to the present invention, if unprogrammable defect bit is included, the associated AND term can be disregarded and the data can be supplied to an unused term. In addition, since the array is reprogrammable, the probability of defective product is low.

I claim:

1. A programmable logic array comprising:
   an AND array having a plurality of first input lines and a plurality of first output lines as AND terms, said AND array being programmed by electrically connecting selected ones of said first input lines and selected ones of said first output lines;

an OR array having a plurality of second input lines connected to corresponding ones of said first output lines and a plurality of second output lines, said OR array being programmed by electrically connecting selected ones of said second input lines and selected ones of said second output lines; and invalidating means for selectively connecting said first output lines forming said AND terms or said second input lines to a constant potential source.

2. A programmable logic array according to claim 1, wherein said invalidating means includes a line connected to said constant potential source, and means for connecting said first output lines or said second input lines to said line.

3. A programmable logic array according to claim 1 wherein said invalidating means includes a plurality of third input lines connected to corresponding ones of said first output lines forming said AND terms or said second input lines and a line connected to a constant potential source, said invalidating means electrically connecting one of said third input lines corresponding to one of said AND terms to be disregarded to said line connected to said constant potential source.

4. A programmable logic array comprising:

an AND array for producing AND term outputs on a plurality of AND term lines;

an OR array connected to said AND term lines to receive said AND term outputs of said AND array as inputs thereto; and invalidating means for selectively connecting said AND term lines to a constant potential source.

5. A programmable logic array according to claim 4 wherein said invalidating means includes a line connected to a constant potential source, said invalidating means for electrically connecting one of said AND term lines corresponding to one of said AND terms to be disregarded to said constant potential source.

* * * * *